(12) United States Patent
Kioussis et al.

(10) Patent No.: US 11,955,263 B2
(45) Date of Patent: *Apr. 9, 2024

(54) TWO-DIMENSIONAL DIRAC HALF-METAL FERROMAGNETS AND FERROMAGNETIC MATERIALS FOR SPINTRONIC DEVICES

(71) Applicant: The Trustees of the California State University, Long Beach, CA (US)

(72) Inventors: Nicholas Kioussis, Northridge, CA (US); Qilong Sun, Northridge, CA (US)

(73) Assignee: The Trustees of the California State University, Long Beach, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/980,694

(22) Filed: Nov. 4, 2022

(65) Prior Publication Data

US 2023/0055260 A1 Feb. 23, 2023

Related U.S. Application Data

(63) Continuation of application No. 16/288,525, filed on Feb. 28, 2019, now Pat. No. 11,495,381.

(60) Provisional application No. 62/637,478, filed on Mar. 2, 2018.

(51) Int. Cl.
| | | |
|---|---|---|
| H01F 10/193 | (2006.01) | |
| B82Y 25/00 | (2011.01) | |
| C01G 45/06 | (2006.01) | |
| H01F 10/00 | (2006.01) | |
| H10N 50/85 | (2023.01) | |

(52) U.S. Cl.
CPC ......... *H01F 10/1936* (2013.01); *C01G 45/06* (2013.01); *H01F 10/007* (2013.01); *B82Y 25/00* (2013.01); *C01P 2002/77* (2013.01); *C01P 2004/24* (2013.01); *C01P 2006/42* (2013.01); *H10N 50/85* (2023.02); *Y10T 428/32* (2015.01)

(58) Field of Classification Search
None
See application file for complete search history.

(56) References Cited

U.S. PATENT DOCUMENTS 11,495,381 B2 * 11/2022 Kioussis ............... C01G 45/06

* cited by examiner

*Primary Examiner* — Kevin M Bernatz
(74) *Attorney, Agent, or Firm* — Sandra Poteat Thompson; Finlayson Toffer Roosevelt & Lilly

(57) ABSTRACT

Ferromagnetic materials are disclosed that comprise at least one Dirac half metal material. In addition, Dirac half metal materials are disclosed, wherein the material comprises a plurality of massless Dirac electrons. In addition, ferromagnetic materials are disclosed that includes at least one Dirac half metal material, wherein the material comprises a plurality of massless Dirac electrons, wherein the material exhibits 100% spin polarization, and wherein the plurality of electrons exhibit ultrahigh mobility. Spintronic devices and heterostructures are also disclosed that include a Dirac half metal material.

10 Claims, 5 Drawing Sheets

TWO-DIMENSIONAL DIRAC HALF-METAL FERROMAGNETS AND FERROMAGNETIC MATERIALS FOR SPINTRONIC DEVICES

This United States Utility Application claims priority to U.S. Provisional Application Ser. No. 62/637,478 filed on Mar. 2, 2018, which is entitled "Two-Dimensional Dirac Half-Metal Ferromagnets for Spintronic Devices" and which is incorporated herein in its entirety by reference.

The work is supported by NSF-Partnership in Research and Education in Materials (PREM) Grant DMR-1205734 and NSF Grant No. ERC TANMS-116050.

FIELD OF THE SUBJECT MATTER

The field of the subject matter is Dirac half-metal materials and ferromagnets and their use with and in relation to spintronic devices.

BACKGROUND

Spintronics, involving transmission and storage of information by manipulating the spin degrees of freedom, has sparked tremendous interest over the past decades, because it offers unique advantages to conventional charge-based electronic devices, such as greater data processing speed, high integration density, low power consumption, and non-volatility [1]. Several key properties have been identified for developing new magnetic materials for spintronic devices: Room-temperature half-metallicity, large magnetocrystalline anisotropy (MCA), high Curie temperature, and high spin mobility [2,3].

Bulk half-metals (HMs), with one spin channel conducting and the other semiconducting are ideal spintronic materials, which exhibit 100% spin polarization [4-6]. However, in order to preserve the half-metallicity at room temperature the band gap of one spin channel should be wide enough to prevent thermally induced spin-flip transitions. An additional challenge is to sustain the half-metallic character in ultrathin HM films [7].

Another distinct class of materials, referred to as "Dirac materials" [8], such as graphene [9], topological insulators [10], Dirac [11], and Weyl semimetals [12], is characterized by low-energy fermionic excitations that behave as massless Dirac particles with linear dispersion. The combination of the intriguing properties of the HMs and the Dirac materials could give rise to yet another exotic state of matter, the so-called Dirac half-metal (DHM), characterized by a band structure with a gap in one channel but a Dirac cone in the other [13,14]. Furthermore, if the DHM possesses strong spin-orbit coupling (SOC), it can trigger a gap opening in one spin channel and drive in turn the system in the quantum anomalous Hall effect (QAH) state. Recent first-principles electronic structure calculations predicted that the bulk crystal structure of $MnF_3$, in the hexagonal $R\bar{3}c$ space group (No. 167), is a DHM [15]. Nevertheless, the multiple Dirac cones do not persist in ultrathin)≈1 nm) $MnF_3$ films irrespective of the surface orientation [16].

While there has been tremendous progress in the field of 2D materials displaying a broad range of electronic and optical properties [9,17,18], most of them in the pristine form are nonmagnetic, thus limiting their applications in spintronics. Although magnetism can be introduced by dopants and defects [13,19], a long-range magnetic order has rarely been observed experimentally in 2D materials. Interestingly, during the past year two teams have observed clear signatures of magnetism in 2D $CrGeTe_3$ [20] and $CrI_3$ van der Waals materials down to the monolayer limit. However, both these 2D materials are ferromagnetic insulators with low Curie temperatures of 45 K and 90 K, respectively. Yet, no 2D DHM pristine material has been experimentally synthesized. Consequently, there is an intense current effort on identifying 2D materials to realize such an exotic state that will also satisfy the above material requirements.

In order to advance the science in this area, novel 2D materials should be developed that have a wide range of intriguing properties, which make them highly promising candidates for the next-generation of ultra-low power, scalable, non-volatile spintronic devices, including: (1) they are robust intrinsic half metals ferromagnets with 100% spin polarization where the band gap of the minority spin channel is large (about 4-5 eV); (2) the majority spin-channel should exhibit a Dirac linear band dispersion leading to the first family of 2D intrinsic ferromagnets, which combine two important properties of both half metallic behavior and massless Dirac electrons; (3) the Dirac electron behavior should be robust upon inclusion of spin-orbit interaction; (4) they should exhibit high Fermi velocities up to $3.83 \times 10^5$ m/s comparable to those in graphene; however, unlike graphene, the electrons in $MnX_3$ are fully spin-polarized; (5) the calculated cohesive energies, phonon dispersion, and finite-temperature Born—Oppenheimer molecular dynamics simulations should demonstrate the stability of these compounds and hence their experimental feasibility; (6) they should have large spin moments (about $4\mu_B$ per Mn atom), large exchange interactions and hence high Curie temperatures (higher than 560 K); (7) the materials should exhibit giant magnetocrystalline anisotropy energy (MCA) (8.71 and 11.86 erg/cm$^2$) with in-plane magnetization orientation.

SUMMARY OF THE SUBJECT MATTER

Ferromagnetic materials are disclosed that comprise at least one Dirac half metal material. In addition, Dirac half metal materials are disclosed, wherein the material comprises a plurality of massless Dirac electrons.

In addition, ferromagnetic materials are disclosed that includes at least one Dirac half metal material, wherein the material comprises a plurality of massless Dirac electrons, wherein the material exhibits 100% spin polarization, and wherein the plurality of electrons exhibit ultrahigh mobility.

Spintronic devices and heterostructures are also disclosed that include a Dirac half metal material.

DETAILED DESCRIPTION

Figure 1:
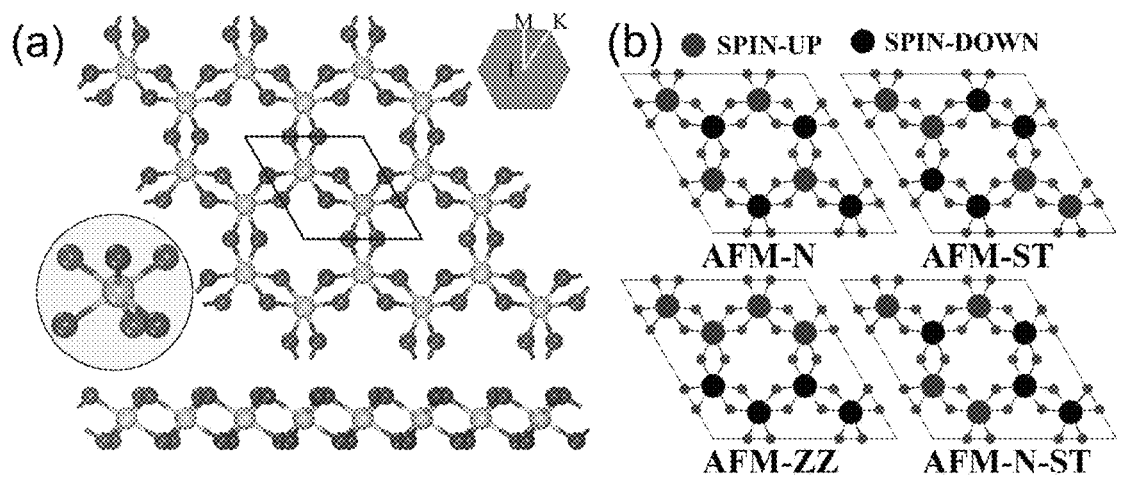
FIG. 1: (a) Top and side views of the 2D $MnX_3$ crystal structure with the unit cell, where the yellow and blue spheres denote the Mn and X atoms, respectively. The $MnX_6$ octahedron with each $Mn^{3+}$ ion coordinated to six $X^-$ ions and the hexagonal Brillouin zone (BZ). (b) Top view of various AFM spin configurations: AFM-Néel (AFM-N), AFM-stripy (AFM-ST), AFM-zigzag (AFM-ZZ), and mixed AFM-N-ST, where the red (black) circles denote the up (down) spins.

As introduced in the Background section, spintronics is a continuously expanding area of research and development merging the areas of magnetism and electronics. It exploits the intrinsic electron spin degrees of freedom, in addition to its charge, to create new functionalities and new devices. [1] The use of spin offers the potential advantages of non-volatility, lower power consumption, enhanced data processing speed, and increased integration densities compared with conventional semiconductor devices. As discussed above, one important challenge is to discover ferromagnetic thin films which exhibit high spin polarization which will in turn enhance both the tunnel magnetoresistance (TMR) and spin transfer torque (STT) for read/write operations. Bulk half-metals, with large intrinsic large spin polarization, are ideal magnetic electrode materials to integrate in spintronics device applications, including Magnetic tunnel junctions (MTJs), giant magnetoresistance devices (GMRs), spin transfer torque, etc. However, the spin polarization of half metals disappears when the film thickness is reduced. Thus, it is critical to discover novel ultrathin ferromagnetic materials, which preserve their half metallicity, have ultrahigh electron mobility, and large magnetic anisotropy.

Spintronics is a field of nanoscale electronics using the injection, manipulation and detection of the spin of the electron, in addition to its charge, for memory and logic applications. Due to advancements in spintronics, information storage has experienced tremendous growth in the past decade because it offers opportunities for a new generation of ultralow power, ultrafast, scalable, and nonvolatile devices. MTJs, consisting of two thin ferromagnetic (FM) films separated by a thin insulating oxide layer, are prototypical spintronic devices, where the state (0 or 1) of the magnetic random access memory (MRAM) bit is stored in the relative orientation (parallel or antiparallel) of the magnetization of the two FM films with different TMR values. However, achieving functional spintronic devices requires the development of novel magnetic materials with desirable properties and integration of such diverse materials with atomic-level control. Crucial properties of the FM thin films include: (1) high spin polarization for large TMR, (2) large magnetic anisotropy to ensure room-temperature bit stability, (3) large voltage control of magnetic anisotropy (VCMA) to reduce the magnetic bit switching energy and write voltage, (4) high electron mobility, and (5) high Curie temperature.

Half-metals (HMs) are a class of bulk materials that are metallic only for one spin direction and semiconducting or insulating for the other spin direction. Consequently, the spin polarization of the conduction electrons should be 100%, thus providing fully spin-polarized currents. However, one of the current bottlenecks using thin half metallic films for MRAM applications, is that they do not retain their half metallic nature and hence the high spin polarization is reduced due to the confinement of the electrons normal to the surfaces/interfaces. Thus, it is critical to discover novel thin film (two-dimensional) ferromagnetic materials, which are half metallic to ensure huge TMR values.

Another distinct class of materials, referred to as "Dirac materials" [8], such as graphene [9], topological insulators [10], Dirac and Weyl semimetals [12], is characterized by low-energy fermionic excitations that behave as massless Dirac particles with linear dispersion. The combination of the intriguing properties of the HMs and the Dirac materials could give rise to yet another exotic state of matter, the so-called Dirac half-metal (DHM), characterized by a band structure with a gap in one channel but a Dirac cone in the other. [13,14] Furthermore, if the DHM possesses strong spin-orbit coupling (SOC), it can trigger a gap opening in one spin channel and drive in turn the system in the quantum anomalous Hall effect (QAH) state. Recent first-principles electronic structure calculations predicted that the bulk crystal structure of $MnF_3$, in the hexagonal $R\bar{3}c$ space group (No. 167), is a DHM [15]. Nevertheless, the multiple Dirac cones do not persist in ultrathin ($\approx 1$ nm) $MnF_3$ films irrespective of the surface orientation [16].

While there has been tremendous progress in the field of 2D materials displaying a broad range of electronic and optical properties [9, 17, 18], most of them in the pristine form are nonmagnetic, thus limiting their applications in spintronics. Although magnetism can be introduced by dopants and defects [14, 19], a long-range magnetic order has rarely been observed experimentally in 2D materials. Interestingly, during the past year two teams have observed clear signatures of magnetism in 2D $CrGeTe_3$ and $CrI_3$ van der Waals materials down to the monolayer limit. However, these 2D materials are ferromagnetic insulators with low Curie temperatures of 45K and 90K, respectively. Yet, no 2D DHM pristine material has been experimentally synthesized. Consequently, there is an intense current effort on identifying 2D materials to realize such an exotic state that will also satisfy the above material requirements.

In addition, it is equally important to search for 2D half metallic materials where the massless Dirac electrons, which exhibit a linear energy-momentum dispersion (similar to graphene), exhibit ultrahigh mobility critical for the operational speed of nanodevices. To date, no such 2D Dirac half-metal ferromagnetic materials have been discovered. The emergence of both half metallic magnetic behavior and massless Dirac electrons, if possible, could open up numerous opportunities for 2D magnetic and magnetoelectric applications.

Atomically thin layered van der Waals (vdW) crystals provide an ideal platform of two-dimensional (2D) material systems which exhibit a wide range of intriguing properties for emerging functional devices, such as ultrafast photodetectors, broadband optical modulators and excitonic semiconductor lasers.[5] Several experiments have shown that one can induce extrinsic magnetism in 2D materials through (1) defect engineering; (2) introducing magnetic species; and (3) the magnetic proximity effect, whereby 2D materials are placed in contact with other magnetic substrates. Nevertheless, no 2D crystal with intrinsic magnetism has yet been discovered. Recently, Huang et. al. demonstrated the 2D ferromagnetism in exfoliated monolayer chromium tri-iodide ($CrI_3$) with out-of-plane spin orientation and a Curie temperature of 45 kelvin. However, $CrI_3$ is not half metal and hence does not exhibit high spin polarization.

In order to advance the science in this area, a novel and contemplated family of 2D materials has been discovered and is disclosed herein, including $MnX_3$ (X=F, Cl, Br, and I) that have a wide range of intriguing properties and contemplated embodiments, which make them highly promising candidates for the next-generation of ultra-low power, scalable, non-volatile spintronic devices: (1) they are robust intrinsic half metals ferromagnets with 100% spin polarization where the band gap of the minority spin channel is large (about 4-5 eV); (2) the majority spin-channel exhibits a Dirac linear band dispersion leading to the first family of 2D intrinsic ferromagnets which combine two important properties of both half metallic behavior and massless Dirac electrons; (3) the Dirac electron behavior is robust upon inclusion of spin-orbit interaction; (4) they exhibit high Fermi velocities up to $3.83 \times 10^5$ m/s comparable to those in graphene; however, unlike graphene, the electrons in $MnX_3$ are fully spin-polarized; (5) the calculated cohesive energies, phonon dispersion, and finite-temperature Born—Oppenheimer molecular dynamics simulations demonstrate the stability of these compounds and hence their experimental feasibility; (6) they have large spin moments (about $4\mu_B$ per Mn atom), large exchange interactions and hence high Curie temperatures (higher than 560 K); (7) The $MnBr_3$ and $MnI_3$ exhibit giant magnetocrystalline anisotropy energy (MCA) (8.71 and 11.86 erg/cm$^2$) with in-plane magnetization orientation. These values are higher by a factor of about 5 compared to ferromagnetic materials (CoFeB) currently used in MRAM applications.

Ferromagnetic materials are disclosed that comprise at least one Dirac half metal material. Contemplated ferromagnetic materials are ultrathin. And as used herein, the term "ultrathin" means it is about or less than about 1 nanometer in average thickness. In some embodiments, the material is doped with at least one other element. As understood, any suitable dopant element is contemplated for these materials. Dopants may be utilized herein for the purpose of modulating or influencing the electrical, optical, or structural properties of the material or materials.

It is understood that contemplated materials have a surface. In some embodiments, the surface is modified with at least one small molecule, at least one defect, at least one additional layer of material, or at least one element.

In some embodiments, contemplated ferromagnetic materials comprise at least one monolayer. Contemplated monolayers or layers may all comprise at least one Dirac half metal material, or some of the contemplated layers may comprise other materials. Contemplated materials are ferromagnetic and monolayer. However, bilayer or thicker layers are also contemplated.

In addition, Dirac half metal materials are disclosed, wherein the material comprises a plurality of massless Dirac electrons. In some embodiments, a contemplated plurality of electrons exhibits ultrahigh mobility. As used herein, the term "ultrahigh" with respect to mobility is calculated using the Fermi velocity. In order to determine if the mobility is ultrahigh, it is compared with the mobility of graphene. In some embodiments, a contemplated Dirac half metal material exhibits 100% spin polarization.

Contemplated Dirac half metal materials comprise at least one manganese trihalide. In some embodiments, a contemplated halide comprises fluorine, chlorine, bromine, or iodine.

In addition, ferromagnetic materials are disclosed that includes at least one Dirac half metal material, wherein the material comprises a plurality of massless Dirac electrons, wherein the material exhibits 100% spin polarization, and wherein the plurality of electrons exhibit ultrahigh mobility, which means that one spin channel is insulating, another spin channel is metallic with Dirac. There are no interactions (noise) between different spin channels leading to more efficient transport, low energy-consumption.

Spintronic devices are also disclosed that include a Dirac half metal material. Contemplated spintronic devices comprise at least one layer of a Dirac half metal material. In contemplated spintronic devices, the Dirac half metal material is two dimensional. Contemplated spintronic devices may also comprise the ferromagnetic materials disclosed herein.

Heterostructures are also contemplated herein that comprise contemplated ferromagnetic materials. In general, heterostructures are structures or assemblies that comprise more than one different material.

As part of this work, two great challenges in spintronics have been solved on how to further enhance the performance of ferromagnetic layer materials with high spin polarization ratio; large magnetocrystalline anisotropy (MCA), excellent carrier mobility, low energy-consumption, and high Curie temperature. The 2D $MnX_3$ layer materials we discovered resolve the shortcomings of bulk half—metallic materials in which the half-metallic features are lost on going to ultrathin layers and provide opportunities for engineering new magneto-optoelectronic devices with superior performance.

In summary, contemplated two-dimensional 'Dirac half metals' with ferromagnetic ground states and high Curie temperature with intriguing properties, discussed in detail above and considered contemplated embodiments, have been discovered that makes them promising for the next-generation spintronics devices. Research reveals that the proposed $MnX_3$ layer materials can maintain their ferromagnetism and half-metallicity up to 560 K. In addition, this family of materials exhibits excellent stability. The intrinsic 2D monolayer structures can be adopted directly as thin film to assemble spintronic devices.

EXAMPLES

Density functional theory (DFT) calculations were carried out using the Vienna ab initio simulation package (VASP) [22,23]. The pseudopotential and wave functions are treated within the projector-augmented wave (PAW) method [24]. Structural relaxations were carried out using the generalized gradient approximation as parametrized by Perdew et al. [25]. The plane-wave cutoff energy was set to 500 eV and a 9×9×1 k mesh was used in the Brillouin zone (BZ) sampling for the relaxation calculations. The band structure was calculated using (i) the DFT+U approach (U=3.9 eV) to treat the strong correlations of the Mn d electrons and (ii) the more accurate Heyd-Scuseria-Ernzerhof (HSE06) functional. For the MCA calculations, the SOC was included with a 31×31×1 k-point mesh. For the phonon calculations the VASP and PHONOPY [28] codes were employed with a 3×3×1 72-atom supercell to determine the dynamical matrix.

Equilibrium structural and magnetic properties. The crystal structure of the $MnX_3$ monolayer, shown in FIG. 1(a), consists of a plane of Mn atoms forming a honeycomb lattice and sandwiched between two X atomic planes, with two Mn and six X atoms per (1×1) unit cell, similar to that of $CrI_3$ [21]. The Mn ions are surrounded by six first-nearest-neighbor halogens arranged in an edge sharing distorted octahedra, shown in FIG. 1(a). In sharp contrast to the crystal structure in Ref. [15] where two Mn ions are bonded by a single anion, two $Mn^{3+}$ in FIG. 1(a) are bonded by two anions. Consequently, the crystal structure in FIG. 1(a) is dramatically distinct than any of the surface orientations of bulk $MnF_3$.

tization along the and directions, respectively. The values of MCA, listed in Table I, show that the MCA<0 indicating the in-plane magnetization orientation in all $MnX_3$'s. Furthermore, the |MCA| increases with increasing halogen size. The value of −0.46 erg/cm$^2$ in $MnCl_3$ is comparable to that of −0.56 erg/cm$^2$ in the ultrathin Au/FeCo/MgO heterostructure [30] for MRAM applications. More importantly, the MCA values of 8.71 erg/cm$^2$ and 11.9 erg/cm$^2$ in $MnBr_3$ and $MnI_3$, respectively, are about an order of magnitude higher than that of 1.4 erg/cm$^2$ in Ta/FeCo/MgO MRAM nanojunc-

TABLE 1

Calculated equilibrium lattice constant, bond lengths of Mn-X and Mn-Mn, angle of the X-Mn-X bond, cohesive energy, magnetic moment of $Mn^{3+}$, and MCA per unit area, respectively, for the FM ground state. We also list values of the energy difference between the FM ground state and the AFM-ZZ and AFM-N-ST states, respectively, of the 2 × 2 × 1 unit cell).

|  | $MnF_3$ | $MnCl_3$ | $MnBr_3$ | $MnI_3$ |
|---|---|---|---|---|
| a (Å) | 5.36 | 6.21 | 6.58 | 7.08 |
| $d_{Mn-X}$ (Å) | 1.96 | 2.38 | 2.55 | 2.77 |
| $d_{Mn-Mn}$ (Å) | 3.09 | 3.58 | 3.83 | 4.08 |
| <Mn_X_Mn (°) | 104.29 | 97.44 | 96.10 | 94.81 |
| $E_{coh}$ (eV/atom) | −4.33 | −3.10 | −2.70 | −2.31 |
| μ ($μ_B$) | 3.92 | 4.08 | 4.18 | 4.27 |
| $E_{AFM-ZZ} - E_{FM}$ (meV) | 273 | 212 | 248 | 250 |
| $E_{AFM-N-ST} - E_{FM}$ (meV) | 115 | 269 | 430 | 436 |
| MCA (erg/cm$^2$) | −0.013 | −0.46 | −8.71 | −11.86 |

We have carried total-energy spin-polarized calculations of the 2×2×1 unit cell of the ferromagnetic (FM) and various antiferromagnetic (AFM) phases, such as the AFM-Noel (AFM-N), the AFM-zigzag (AFM-ZZ), the AFM-stripy (AFM-SR), and the mixed AFM-N-ST, respectively, shown in FIG. 1(b). We find (Table I) that the optimized FM is the ground state for all $MnX_3$ and that the next highest-energy configuration is the AFM-ZZ for X=Cl, Br, and I and the AFM-N-ST for X=F. Table I lists values of the equilibrium lattice constants, the Mn—Mn and Mn—X bond lengths, the X—Mn—X angle, the Mn magnetic moments, and cohesive energies for the FM phase. We also list values of the energy differences, between the most likely AFM-ZZ and AFM-N—S and the FM ground state. As expected, the lattice constant, the Mn—Mn and Mn—X bond lengths increase as the halogen anion's ionic radius increases. For the $MnF_3$ ML, the Mn—F bond length of 1.96 Å is close to the value of 1.93 Å in bulk p-$MnF_4$, implying strong chemical bonding. Similarly, the cohesive energy decreases with an increasing atomic number of the halogen due to the decreasing electronegativity of the halogen anion.

The magnetic moment per Mn atom of the FM phase, also listed in Table I, increases from 3.92$μ_B$ in $MnF_3$ to 4.27$μ_B$ in $MnI_3$. The magnetic moment is consistent with the +3-oxidation state of Mn and hence the $4s^03d^4$ electronic configuration. In the octahedral environment of the six halogens the 3d energy split into a higher-energy e g doublet and a lower-energy $t_{2g}$ triplet, resulting in a spin s=$2t^3_{2g}e^1$ g electronic configuration for the $Mn^{+3}$ ion according to the Hund's rule coupling. This is similar to the 2D organometallic honeycomb framework with different embedded transition metals. The electron localization function for $MnF_3$ displayed in FIG. 4S(b) (Supplemental Material [29]), shows strong localization of the electron density around the metal cations and halogen anions representative of Mn—X ionic bonding.

The MCA per unit area A is, MCA=$[E_{[100]}-E_{[001]}]$/A, where $E_{[100]}$ and $E_{[001]}$ are the total energies with magnetions. The giant MCA values presumably arise from the strong SOC of the heavier X=Br, I, suggesting that introduction of heavy elements in transition metal-based films, may be an efficient strategy in enhancing the MCA.

Figure 2:
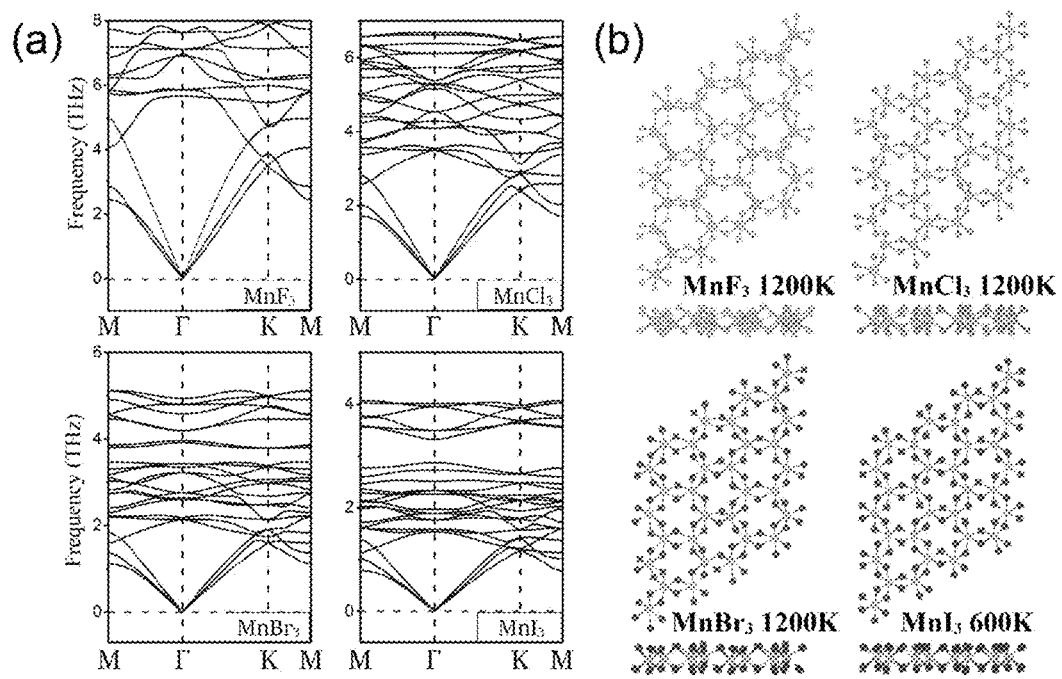
FIG. 2: (a) Calculated phonon dispersion curves of the 2D $MnX_3$. (b) Top and side views of atomic structure snapshots from BOMD simulations at 1200 K or 900 K.

Dynamical and thermal stability. In order to corroborate the dynamical stability of the FM ground state of the 2D $MnX_3$ we have carried out both phonon calculations and ab initio Born Oppenheimer molecular dynamics (BOMD) simulations. The phonon dispersions of the $MnX_3$, shown in FIG. 2(a), exhibit similar overall shape with the phonon frequencies softening with increasing mass of X. The absence of imaginary frequencies confirms the dynamical stability of all $MnX_3$ monolayers. FIG. 2(b) and Supplemental Material, FIG. 1S, show the snapshots of the $MnX_3$ atomic configurations after annealing for 10 ps at different temperatures of 300, 600, 900, and 1200 K, respectively. One can clearly see that the 2D monolayers retain their honeycomb atomic structures up to 1200 K for $MnF_3$, $MnCl_3$, and $MnBr_3$, and up to 600 K for $MnBr_3$ [see FIG. 1S(d) in Supplemental Material [29]]. This is consistent with the higher cohesive energies of the lighter $MnX_3$ systems. These results demonstrate that the 2D manganese trihalides are both dynamically and thermally stable for various room-temperature spintronic applications.

Figure 3:
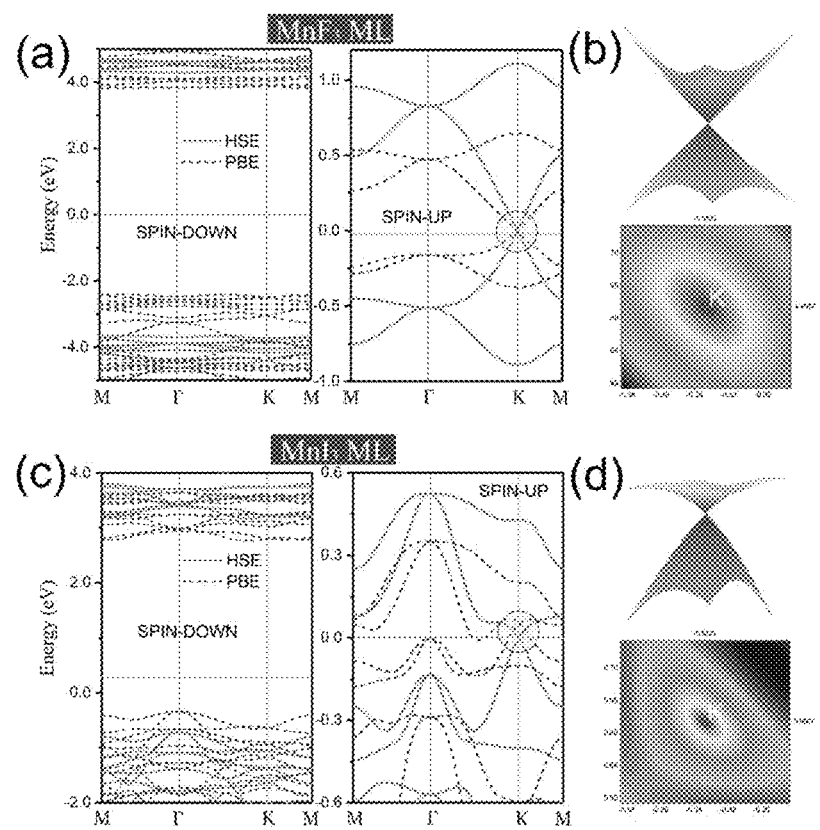
FIG. 3: (a) and (c) Minority- and majority-spin band structure of the 2D $MnF_3$ and $MnI_3$ FM phase using the DFT+U and HSE06 method. (b) and (d) 3D band structure of the Dirac cone at the K symmetry point and the corresponding projection on the BZ around the Fermi energy (set at zero).

Electronic structure. FIGS. 3(a) and 3(c) show the minority- and majority-spin band structures of the FM phase for the $MnF_3$ and $MnI_3$ monolayer, respectively, employing the PBE+U (orange curves) and the more accurate hybrid HSE06 (blue curves) functional. Similar band structures for the $MnCl_3$ and $MnBr_3$ are displayed in FIGS. 2S(a) and 2S(c) in Supplemental Material [29]. These calculations reveal that all $MnX_3$ exhibit two fascinating properties which are independent of the exchange correlation functional: (1) The minority-spin channel is an insulator with an unusually large gap, and (2) the majority-spin channel exhibits Dirac cones at the three high-symmetry K points at the Fermi level ($E_F$) for X=F, Cl, Br. While the Dirac cone is in the vicinity of $E_F$ for the heaviest $MnI_3$ at the PBE+U level, the HSE06 functional shifts it at the $E_F$. Consequently, we predict that the 2D MnX$_3$ are intrinsic DHMs. The PBE+U values of the band gap of the minority spin channel are 6.3 eV, 4.33 eV, 3.85 eV, and 3.10 eV for the MnF$_3$, MnCl$_3$, MnBr$_3$, and MnI$_3$, respectively. The PBE functional underestimates the gap by about 20% compared to the corresponding HSE06 values of 7.94 eV, 5.42 eV, 4.79 eV, and 3.89 eV, respectively. The HSE06 values of the Fermi velocities of the Dirac electrons are 3.83×10$^5$, 2.40×10$^5$, and 2.31×10$^5$ m/s for MnF$_3$, MnCl$_3$, and MnBr$_3$, respectively, close to the value of 8×10$^5$ m/s in graphene. For MnI$_3$ the Fermi velocities of the Dirac electrons and holes are 1.56× 10$^5$ m/s and 3.36×10$^5$ m/s, respectively. The combination of 100% spin polarization and massless Dirac fermions renders this family a natural candidate for future applications in spintronics and optoelectronics.

The three-dimensional (3D) majority-spin band profiles around $E_F$ near K are shown in FIGS. 3(b) and 3(d) for MnF$_3$ and MnI$_3$, and in FIGS. 2S(b) and 2S(d) in Supplemental Material for MnCl$_3$ and MnBr$_3$, respectively. With an increasing atomic number of the halogen, the Dirac cone of the conduction band minimum becomes flatter while there is no significant change of the cone of the valence band maximum. The corresponding projection of the Dirac cones on the 2D BZ around the Fermi level are shown in FIGS. 3(b) and 3(d).

Figure 4:
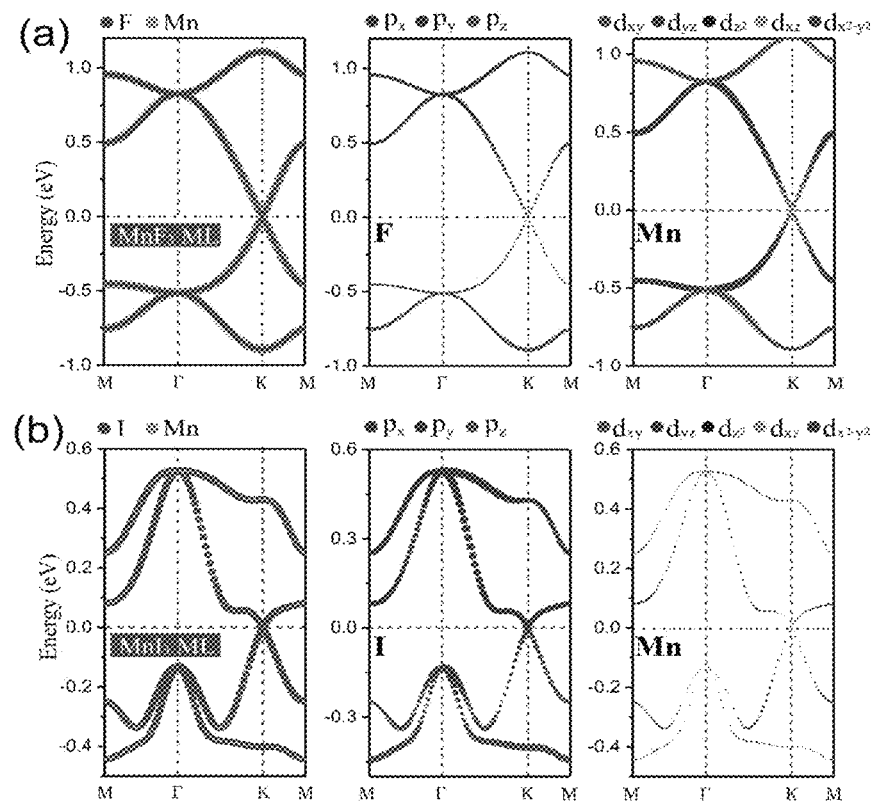
FIG. 4: Energy and k contribution of atom-resolved (left panel), halogen-p-resolved (middle panel), and Mn-d-resolved (right panel) to the majority-spin bands for (a) $MnF_3$ and (b) $MnI_3$ using the HSE06 functional. The color intensity denotes the amplitude of the atom- and/or orbital-resolved character.

The atom- and orbital-resolved majority-spin band structures obtained with the HSE06 functional are shown in FIGS. 4(a) and 4(b) for X=F, I, and in FIGS. 3S(a) and 3S(b) in Supplemental Material for X=Cl, Br, respectively. Overall, we find that the linearly dispersive majority-spin electronic bands at the Fermi energy arise from hybridization primary of the Mn-derived $d_{xz}$ and $d_{yz}$ (and to a smaller extent of $d_{x^2-y^2}$) states with the halogen-derived in-plane $p_x$ and $p_y$ states. The relative strength of the X-$p_{x,y}$ to the Mn-$d_{xz,yz}$ contribution increases as the halogen atomic size increases down the group, where the Dirac cone is mainly composed of Mn-d derived states in MnF$_3$ and of X-p states in MnI$_3$. The valence and conduction bands of the Dirac cone are composed mainly of anion-$p_x$ and -$p_y$ derived states, respectively. The low-energy Dirac cone Mn-d-derived states in MnF$_3$ are in sharp contrast to the corresponding p-derived states in graphene. In addition, the weak hybridization of the in-plane halogen-$p_{x,y}$ Dirac states with the underlying substrates will presumably preserve the Dirac cone, as opposed to the strong out-of plane $\pi(p_z)$ hybridization of graphene bonds with substrates.

Effect of Spin-Orbit Coupling.

Figure 6:
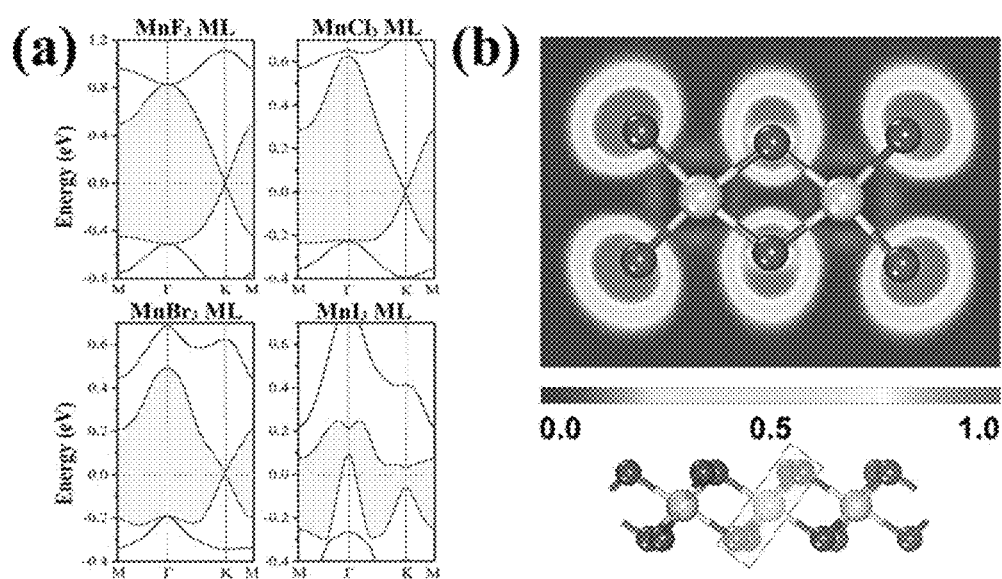
FIG. 6: (a) Band structures of the 2D $MnX_3$ determined by the HSE06 functional in the presence of SOC, where the Fermi level is set at zero; (b) Electron localization function (ELF) of the side view atomic configuration shown on the panel below where the red (blue) color denote regions where ELF=1 (0) corresponding to accumulation (depletion) of electron charge density.

FIG. 6 shows the band structure of MnX$_3$ determined by the HSE06 functional in the presence of SOC. The inclusion of SOC triggers a small gap opening of ~3-10 meV at the high symmetry K point indicating that the 100% spin polarization will be maintained at room temperature. Remarkably, the linear band dispersion of the majority spin channel is also preserved in the presence of SOC for the lighter halogens (X=F, Cl, and Br). On the other hand, the large SOC of the iodine induces (i) a gap opening of ~91 meV at K, and (ii) splits the doubly degenerate I-derived $p_{x,y}$ states at −0.15 eV below $E_F$ at Γ [see FIG. 4(b)] into one band ~0.1 eV above $E_F$ and the other ~0.3 eV below $E_F$, thus preserving the half-metallicity of MnI$_3$.

To identify the topological properties of the gapped state of the lighter MnX$_3$, we have calculated the Chern number of MnBr$_3$, which exhibits the largest gap. We have employed the Wannier charge centers approach [31], where the maximally localized Wannier functions were constructed from the first-principles calculations including SOC using the Wannier90 package [32]. The Chern number for the MnBr$_3$ monolayer is calculated from the evolution of the hybrid Wannier charge centers (HWCCs) during a time-reversal pumping process [33,34]. The Chern number, $$C = \frac{1}{ea}[P_e^h(2\pi) - P_e^h(0)],$$

where a is the lattice constant, $P_s^h(k_y) = e\Sigma_n(\bar{x}_n k_y)$ is the hybrid electronic polarization, and the HWCC, $\bar{x}_n k_y$, is a smooth function of $k_y$ for $k_y \in [0, 2\pi]$. Namely, the Chern number can be viewed as the number of electronic charges pumped across one unit cell in the course of a cycle [35]. We find an odd Chern number, C=−1, for MnBr$_3$, indicating that it is a QAH insulator with a topological nontrivial gap. To corroborate this result we have calculated the band structures of the zigzag and armchair edges of the MnBr$_3$ ribbon, which are displayed in FIG. 5(a). The emergence of a single chiral topologically protected gapless edge state near $E_F$ connecting the 2D valence and conduction bands is consistent with the calculated Chern number. Thus, we predict that MnF$_3$, MnCl$_3$, and MnBr$_3$ provide a promising platform for exploring the QAH effect at ~60-100K, which is three orders of magnitude higher than the temperature of 100 mK at which the QAH was recently observed in Cr-doped Bi$_2$Se$_3$ films [36].

Magnetic Properties.

Figure 5:
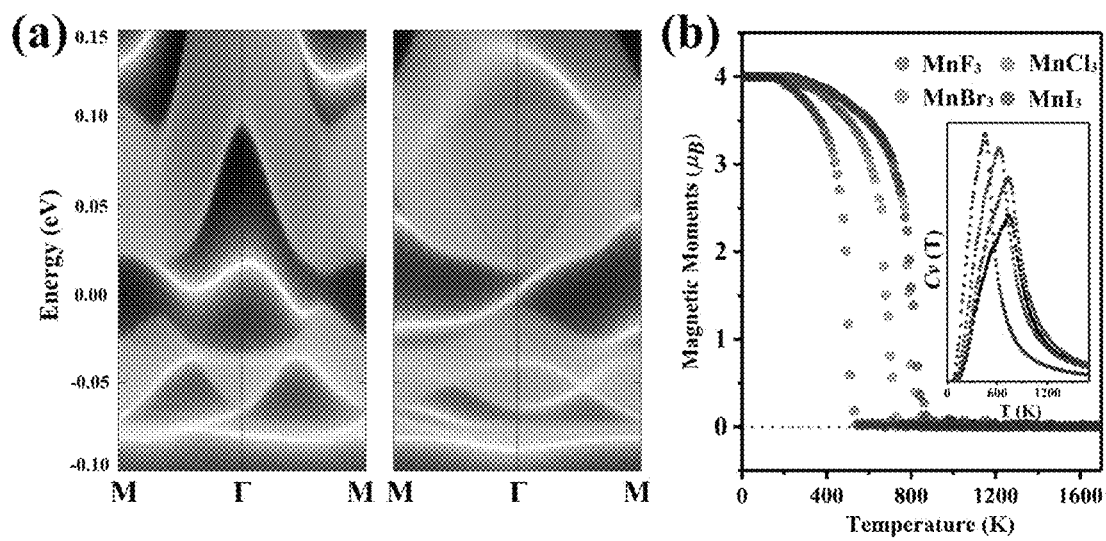
FIG. 5: (a) Band structure of the zigzag (left) and the armchair (right) edges of the $MnBr_3$ ribbon, with the edge states connecting the 2D valence and conduction bands. (b) Temperature variation of the $Mn^{3+}$ magnetic moment for the 2D $MnX_3$. (Inset) Temperature variation of the heat capacity.

Since the values of the X—Mn—X angle, listed in Table I, are close to 90° the superexchange interaction between two nearest-neighbor (NN) Mn atoms mediated by X are expected to be FM and dominant (the direct AFM exchange interactions are weak due to the large Mn—Mn distance). The exchange interaction parameters $J_{i,j}$ are determined by expressing the DFT total energies of the various FM and AFM configurations to the Heisenberg spin Hamiltonian, $\hat{H} = -J'_{i,j} \Sigma_{i,j} \hat{S}_i \hat{S}_j$, defined on a honeycomb lattice, where $|\vec{S}|=3$I. The second- and third-NN exchange interactions are smaller than the first-NN interaction $J_1$, which increases from 3.8 meV in MnF$_3$ to 10 meV in MnI$_3$. Using the DFT-derived exchange interactions, we have determined the Curie temperature Tc, using Metropolis Monte Carlo simulations of the 100×100 2D honeycomb lattice with periodic boundary conditions. The temperature variation of the Mn$^{3+}$ magnetic moment for the MnX$_3$ is shown in FIG. 5(b). We find that Tc increases from 450K in MnF$_3$ to 720K in MnI$_3$, which are higher than that of ≈66K in CrI$_3$. The inset shows the temperature variation of the specific heat which peaks at Tc.

In summary, contemplated embodiments show that the 2D pristine manganese trihalides is a family of intrinsic Dirac half-metals which exhibits many unique properties, including 100% spin polarization, massless Dirac fermions with high carrier mobility, large magnetic moments, high Curie temperatures, and large in-plane magnetic anisotropy. Consequently, they meet many requirements of high-efficiency spintronic applications. We demonstrate that the MnX$_3$ are dynamically and thermodynamically stable up to high temperatures and hence could be synthesized experimentally by an exfoliation process commonly employed in other 2D van der Waal crystals. Lastly, in contrast with conventional FM films, which interact strongly with the underlying substrates, the electronic and magnetic properties of these 2D van der Waals DHMs can remain on substrates.

Thus, specific embodiments, methods of use, and production of two-dimensional Dirac half-metal materials and ferromagnets for spintronic devices have been disclosed. It should be apparent, however, to those skilled in the art that many more modifications besides those already described are possible without departing from the inventive concepts herein. The inventive subject matter, therefore, is not to be restricted except in the spirit of the disclosure herein. Moreover, in interpreting the specification, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

REFERENCES

The references included below are incorporated by reference herein.

1. S. A. Wolf, D. D. Awschalom, R. A. Buhrman, J. M. Daughton, S. von Molnar, M. L. Roukes, A. Y. Chtchelkanova, and D. M. Treger, *Spintronics: A spin-based electronics vision for the future*, Science 294, 1488 (2001).
2. A. Hirohata, H. Sukegawa, H. Yanagihara, I. Žutic, T. Seki, S. Mizukami, and R. Swaminathan, Roadmap for emerging materials for spintronic device applications, IEEE T. Magn. 51, 1 (2015).
3. Y. Sun, Z. Zhuo, X. Wu, and J. Yang, Room-temperature ferromagnetism in two-dimensional $Fe_2Si$ nanosheet with enhanced spin-polarization ratio, Nano Lett. 17, 2771 (2017).
4. R. A. de Groot, F. M. Mueller, P. G. van Engen, and K. H. J. Buschow, *New Class of Materials: Half-Metallic Ferromagnets*, Phys Rev. Lett. 50, 2024 (1983).
5. J.-H. Park, E. Vescovo, H.-J. Kim, C. Kwon, R. Ramesh, and T. Venkatesan, Direct evidence for a half-metallic ferromagnet, *Nature* (London) 392, 794 (1998).
6. P. Mavropoulos, M. Ležaić, and S. Blügel, *Half-metallic ferromagnets for magnetic tunnel junctions by ab initio calculations*, Phys. Rev. B 72, 174428 (2005).
7. I. Galanakis, *Surface properties of the half-and full-Heusler alloys*, J. Phys: Condens. Matter 14, 6329 (2002).
8. T. O. Wehling, A. M. Black-Schaffer, and A. V. Balatsky, *Dirac materials*, Adv. Phys. 63, 1 (2014).
9. K. S. Novoselov, A. K. Geim, S. V. Morozov, D. Jiang, Y. Zhang, S. V. Dubonos, I. V. Grigorieva, and A. A. Firsov, *Electric field effect in atomically thin carbon films*, Science 306, 666 (2004).
10. M. Z. Hasan and C. L. Kane, *Topological insulators*, Rev. Mod. Phys. 82, 3045 (2010).
11. Z. K. Liu, J. Jiang, B. Zhou, Z. J. Wang, Y. Zhang, H. M. Weng, D. Prabhakaran, S-K. Mo, H. Peng, P. Dudin, T. Kim, M. Hoesch, Z. Fang, X. Dai, Z. X. Shen, D. L. Feng, Z. Hussain, and Y. L. Chen, *A stable three-dimensional topological Dirac semimetal $Cd_3As_2$*, Nat. Mater. 13, 677 (2014).
12. X. Wan, A. M. Turner, A. Vishwanath, and S. Y. Savrasov, *Topological semimetal and Fermi-arc surface states in the electronic structure of pyrochlore iridates*, Phys. Rev. B 83, 205101 (2011).
13. Y. Li, D. West, H. Huang, Jia Li, S. B. Zhang, and W. Duan, *Theory of the Dirac half metal and quantum anomalous Hall effect in Mn-intercalated epitaxial graphene*, Phys. Rev. B 92, 201403 (2015).
14. Z. F. Wang, Z. Liu, and F. Liu, *Quantum Anomalous Hall Effect in 2D Organic Topological Insulators*, Phys. Rev Lett. 110, 196801 (2013).
15. Y. Jiao, F. Ma, C. Zhang, J. Bell, S. Sanvito, and A. Du, *A First-Principles Prediction of Spin-Polarized Multiple Dirac Rings in Manganese Fluoride*, Phys. Rev. Lett. 119, 016403 (2017).
16. Q. Sun and N. Kioussis (private communication 2017).
17. K. F. Mak, K. L. McGill, J. Park, and P. L. McEuen, *The valley Hal effect in $MoS2$ transistors*, Science 344, 1489 (2014).
18. Q. Sun, Y. Dai, Y. Ma, Na Yin, W. Wei, Lin Yu, and B. Huang, *Design of lateral heterostructure from arsenene and antimonene*, 2D Mater. 3, (3017 (2016).
19. J. Červenka, M. I. Katsnelson, and C. F. J. Flipse, *Room-temperature ferromagnetism in graphite driven by two-dimensional networks of point defects*, Nat Phys. 5, 840 (2009).
20. C. Gong, L. Li, Z. Li, H. Ji, A. Stern, Y. Xia, T. Cao, W. Bao, C. Wang, Y. Wang, Z. Q. Qiu, R. J. Cava, S. G. Louie, J. Xia, and X. Zhang, *Discovery of intrinsic ferromagnetism in two-dimensional van der Waals crystals*, Nature (London) 546, 265 (2017).
21. B. Huang, G. Clark, E. Navarro-Moratalla, D. R. Klein, R. Cheng, K. L. Seyler, D. Zhong, E. Schmidgall, M. A. McGuire, D. H. Cobden, W. Yao, D. Xiao, P. Jarillo-Herrero, and X. Xu, *Layer-dependent ferromagnetism in a Van der Waals crystal down to the monolayer limit*, Nature (London) 546, 270 (2017).
22. G. Kresse and J. Furthmüller, *Efficient iterative schemes for ab initio total-energy calculations using a plane-wave basis set*, Phys. Rev. B 54, 11169(1996).
23. G. Kresse and J. Furthmüller, *Efficiency of ab-initio total energy calculations for metals and semiconductors using a plane-wave basis set*, Comput. Mater. Sci. 6, 15 (1996).
24. P. E. Böchl, *Projector augmented-wave method*, Phys. Rev. B 50, 17953 (1994).
25. J. P. Perdew, K. Burke, and M. Ernzerhof, *Generalized Gradient Approximation Made Simple*, Phys Rev. Lett. 77, 3865 (1996).
26. V. I Anisimov, F. Aryasetiawan, and A. I. Lichtenstein, First-Principles calculations of the electronic structure and spectra of strongly correlated systems: The LDA+U method J. Phys.: Condens Matter 9, 767 (1997).
27. J. Heyd, G. E. Scuseria, and M. Ernzerhof, *Hybrid functionals based on a screened Coulomb potential*, J. Chem. Phys. 118, 8207 (2003).
28. A. Togo and I. Tanaka, *First principles phonon calculations in materials science*, Scr. Mater. 108, 1 (2015).
29. See Supplemental Material at http://link.aps.org/supplemental/10.1103/PhysRevB.97.094408 for electronic properties of $MnX_3$.
30. P. V. Ong, N. Kioussis, P. K. Amiri, and K. L. Wang, *Electric-field-driven magnetization switching and nonlinear magnetoelasticity in Au/FeCo/MgO heterostructures*, Sci Rep. 6, 29815 (2016).
31. M. Taherinejad, K. F. Garrity, and D. Vanderbilt, *Wannier center sheets in topological insulators*, Phys. Rev. B 89, 115102 (2014).
32. A. A. Mostofi, J. R. Yates, G. Pizzi, Y.-S. Lee, I. Souza, D. Vanderbilt, and N. Marzari, *An updated version of* WANNIER 90: A tool for obtaining maximally-*localised Wannier functions*, Comput. Phys. Commun 178, 685 (2008).
33. R. Yu, X. L. Qi, A. Bernevig, Z. Fang, and X. Dai, *Equivalent expression of Z2 topological invariant for* band insulators using the non-Abelian Berry connection, Phys. Rev. B 84, 075119 (2011).
34. D. Gresch, G. Autes, O. V. Yazyev, M. Troyer, D. Vanderbilt, B. A. Bernevig, and A. A. Soluyanov, *Z2Pack: Numerical implementation of hybrid Wannier centers for identifying topological materials*, Phys. Rev B 95. (075146 (2017).
35. Q. Wu, S. Zhang, H.-F. Song, M. Troyer, and A. A. Soluyanov, *Wannier Tools: An open-source software package for novel topological materials*, Comput. Phys. Commun. 224, 405 (2018).
36. C. Z. Chang, J. Zhang, X. Feng, J. Shen, Z. Zhang, M. Guo, K. Li, Y. Ou, P. Wei, L. L. Wang, Z. Q. Ji, Y. Feng, S. Ji, X. Chen, J. Jia, X. Dai, Z. Fang, S.-C. Zhang, K. He, Y. Wang, L. Lu, X. C. Ma, and Q. K. Xue, *Experimental observation of the quantum anomalous Hall effect in a magnetic topological insulator*, Science 340, 167 (2013).
37. Tanaka, C. T., J. Nowak, and J. S. Moodera, Spin-polarized tunneling in a half-metallic ferromagnet. *J. Appl. Phys.*, 86, 6239-42 (1999).
38. Bhatti, S., et al., Spintronics based random access memory: a review. *Mater. Today*, 2017.
39. Rozhkov, A. V., et al., Spin-valley half-metal as a prospective material for spin valleytronics. *Phys. Rev. Lett.*, 119, 107601 (2017).
40. Liu, Y., et al., Van der Waals heterostructures and devices. *Nature Rev. Mater.*, 1, 16042 (2016).

The invention claimed is:

1. A ferromagnetic material, comprising at least one Dirac half metal material having a Fermi velocity up to $3.83 \times 10^5$ m/s as compared to a Fermi velocity of graphene, the material comprising two-dimensional manganese trihalide crystals that are ferromagnetic, wherein the material exhibits 100% spin polarization, a high Curie temperature of 560K or higher, and a band gap of the minority spin channel of at least 4 eV.

2. The ferromagnetic material of claim 1, wherein the ferromagnetic material is ultrathin.

3. The ferromagnetic material of claim 2, wherein ultrathin is about 1 nanometer in thickness.

4. The Dirac half metal material of claim 1, wherein the halide of the trihalide comprises fluorine, chlorine, bromine, or iodine.

5. A spintronic device comprising the ferromagnetic material of claim 1.

6. The spintronic device of claim 5, comprising at least one layer of a Dirac half metal material.

7. The ferromagnetic material of claim 1, wherein the material is doped with at least one other element.

8. The ferromagnetic material of claim 1, wherein the material has a surface, and wherein the surface is modified with at least one molecule, at least one defect, at least one additional layer of material, or at least one element.

9. A heterostructure comprising the ferromagnetic material of claim 1.

10. The heterostructure of claim 9, wherein the heterostructure is vertical or lateral.

* * * * *